(12) United States Patent
Shimamoto

(10) Patent No.: US 7,414,483 B2
(45) Date of Patent: Aug. 19, 2008

(54) TEST CIRCUIT, DELAY CIRCUIT, CLOCK GENERATING CIRCUIT, AND IMAGE SENSOR

(75) Inventor: Yukihiro Shimamoto, Ikoma (JP)

(73) Assignee: Sharp Kabushiki Kaisha, Osaka (JP)

( * ) Notice: Subject to any disclaimer, the term of this patent is extended or adjusted under 35 U.S.C. 154(b) by 85 days.

(21) Appl. No.: 11/480,537

(22) Filed: Jul. 5, 2006

(65) Prior Publication Data
US 2007/0008044 A1 Jan. 11, 2007

(30) Foreign Application Priority Data
Jul. 5, 2005 (JP) .............................. 2005-195716

(51) Int. Cl.
*H03L 7/08* (2006.01)
*H03H 11/26* (2006.01)
(52) U.S. Cl. ........................................ 331/44; 327/261
(58) Field of Classification Search .................... 331/57, 331/44
See application file for complete search history.

(56) References Cited

U.S. PATENT DOCUMENTS 6,737,926 B2 * 5/2004 Forbes .......................... 331/57
6,781,470 B2 * 8/2004 Rogerson ..................... 331/57
2002/0118071 A1 * 8/2002 Langston ..................... 331/47
2005/0110548 A1 * 5/2005 Suda et al. ................... 327/277

FOREIGN PATENT DOCUMENTS

| JP | 2003-121505 | 4/2003 |
| KR | 1993-0008420 | 8/1993 |

* cited by examiner

*Primary Examiner*—Joseph Chang
(74) *Attorney, Agent, or Firm*—Nixon & Vanderhye P.C.

(57) ABSTRACT

A test circuit comprises a delay circuit 11 with controllable delay, a phase comparator circuit 12 for comparing the phases between the clock signal S0 and a delay clock signal S1 delayed from the clock signal S0 by the delay circuit 11, a meas counter 13 for counting the number of outputs of the prescribed comparison result from the phase comparator circuit 12, a signal switching circuit 14 for switching an input signal to the delay circuit 11 from the clock signal S0 to a delay signal satisfying an oscillation condition where the delay signal is received from the delay circuit 11 and developing a ring oscillator, and a frequency measuring circuit 15 for measuring an oscillation frequency when the ring oscillator is developed, the delay circuit 11 includes a variable delay circuit 17 with variable delay units connected to control the delay in each variable delay units independently.

14 Claims, 14 Drawing Sheets

| S2 | Unit"1" | Unit"2" | Unit"3" | Unit"4" | ...... | Unit"63" | Td(ps) |
|---|---|---|---|---|---|---|---|
| #00 | Tf | Tf | Tf | Tf | ...... | Tf | 16640 |
| #01 | Ts | Tf | Tf | Tf | ...... | Tf | 16660 |
| #02 | Ts | Ts | Tf | Tf | ...... | Tf | 16680 |
| #03 | Ts | Ts | Ts | Tf | ...... | Tf | 16700 |
| .. | .. | .. | .. | .. | ...... | .. | .. |
| #3F | Ts | Ts | Ts | Ts | ...... | Ts | 17920 |

Fig. 4

TEST CIRCUIT, DELAY CIRCUIT, CLOCK GENERATING CIRCUIT, AND IMAGE SENSOR

CROSS REFERENCE TO RELATED APPLICATION

This Nonprovisional application claims priority under 35 U.S.C. §119(a) on Patent Application No. 2005-195716 filed in Japan on Jul. 5, 2005, the entire contents of which are hereby incorporated by reference.

BACKGROUND

1. Field of the Technology

The present technology relates to a test circuit for evaluating timing accuracy of a clock signal generated by a PLL circuit or the like, and particularly to a built-in type test circuit for examining the effect of jitter in a clock signal at high precision. The present invention also relates to a clock generating circuit such as a PLL circuit and an image sensor equipped with the test circuit, as well as to a delay circuit assembled in the test circuit.

2. Description of the Related Art

In the field of high-speed image processing technologies, the demand has been increased for transferring data at high speed with the use of a highly accurate clock signal which carries less jitter. For example, the mobile telephone technology requires devices for exchanging image data at a rate of 400 Mbps. On the other hand, PLL (phase locked loop) circuits which generate clock signals for high-speed data communication are widely known for multiplying the reference clock to generate high-speed clock signals. As the clock signal generated in such a PLL circuit often carries jitters (fluctuations of the signal waveform), its timing for high-speed communication largely depends on the accuracy of timing actions in the PLL circuit.

It is hence necessary for guaranteeing the timing of the high-speed data communication to test the timing actions in the PLL circuit at an accuracy level of 100 ps or shorter. In common, the accuracy of the timing actions for jitters in the PLL circuit is measured with the use of an external measuring means such as an analog LSI tester or any other high-performance tester. Such an external measuring means is however too low in the measuring accuracy to have a result of the test at a rate of 100 ps or shorter. As disclosed in Japanese Patent Laid-open Publication No. 2003-121505 (referred to as Citation 1 hereinafter), a test circuit and a test method are proposed for examining the effect of jitter in a PLL circuit at higher precision.

The test circuit disclosed in Citation 1 includes, as illustrated in FIG. 8, a delay circuit for producing variable delays (constituted from base delay and adjustable delay), whereby the effect of jitter just after a voltage controlled oscillator (VCO) in the PLL circuit can be measured from a difference of the timing between the output signal of the VCO and a delay signal which has been delayed by one cycle from the output signal in the delay circuit. In addition, the effect of jitter in a duration from the rise to the fall or from the fall to the rise of the output signal of the VCO can be measured from a difference of the timing between the output signal of the VCO and a delay signal which has been delayed by a half the cycle from the output signal. Moreover, the duty ratio of the output signal of the VCO can be calculated from the measurement of jitter with the use of the same circuitry arrangement.

While the test circuit and the test method disclosed in Citation 1 are capable of examining the effect of jitter in a PLL circuit at higher precision, their drawback is that the delay of the delay circuit (the base delay and the adjustable delay) has to be adjusted at higher accuracy for guaranteeing the accuracy of the measurement of jitter in the PLL circuit. Citation 1 however fails to clarify a specific circuitry arrangement for precisely adjusting and determining the delay of the delay circuit.

In general, the PLL circuit is accompanied with a logic circuit and assembled together in one chip. When the delay circuit in the test circuit is implemented by the logic circuit, it can also favorably be assembled in the chip.

FIG. 10 illustrates a circuitry arrangement of the logic circuit which acts as the delay circuit. The circuit shown in FIG. 10 is a variable delay circuit 50 as a part of the delay circuit, in which four delay elements 51, each element composed of two inverter circuits, are connected in series so that their four output signals are received and selectively distributed by a selector 52. The delay circuit hence includes two or more (for example sixteen) of the variable delay circuits 50 connected in series for forming a variable delay circuitry arrangement. Switching a selection of the output signals of the delay elements 51 along the signal path at the selector 52 by a control signal, a desired length of the delay from the input to the output of the variable delay circuit 50 can be determined.

However, this causes the delay from the input to the output of the variable delay circuit 50 to contain a delay component derived from the selector 52 and the extension of the signal path in the variable delay circuit 50 in addition to the delay determined by the delay elements 51 connected in series along the signal path. More particularly, when the selector 52 is switched from one port to another, the extension of the signal path for the output signals of the delay elements 51 and the signal path in the selector 52 are varied. Accordingly, the delay component derived from the selector 52 and the extension of the signal path in the variable delay circuit 50 shall possibly depend on the selecting action of the selector 52. In particular, since the examining of the timing actions in the PLL circuit for high-speed data communications is conducted at a rate of 100 ps or shorter, its delay device needs to be controlled at the resolution of 20 ps or shorter and thus permits no significant variations in the delay along the signal path and in the selector 52.

The performance of the test circuit and the test method disclosed in Citation 1 is based on the following factors; the resolution in the variable delay circuit 50 determines the test resolution, the relationship between the setting of delay to the variable delay circuit 50 and the actual delay is rather monotonous or the delay is simply increased or decreased in proportion to the setting, and the duty ratio of oscillation cycle of a ring oscillator (between high level and low level) at the actual delay measurement is 50% (1:1) or the delay in a rise signal and the delay in a fall signal received by the delay circuit are equal to each other. However, the conventional delay circuit implemented by the logic circuit may have three different disadvantages; (1) lower resolution, (2) non-monotony, and (3) duty error (variations from 50% in the duty rate). The three disadvantages will be explained in more detail.

(1) The lower resolution results from the fact that the resolution of the delay in the variable delay circuit 50 is based on the gate delay determined by the two inverter circuits of the delay element 51. Also, the gate delay-based circuitry arrangement shown in FIG. 10 has a design error derived from variations in the delay along the signal path or across the selector 52 and the delay due to discrepancy in the direction of signal transmission between the delay element 51 and the selector 52. This will disturb the improvement of the circuitry design for minimizing the variations and increasing the resolution. Moreover, since test accuracy or resolution is governed by the gate delay of the two inverter circuits, it is impossible to improve the resolution so as to be shorter than that of the gate delay of the inverter circuits.

(2) When the non-monotony is involved where the actual delay fails to change linearly or monotonously in proportion to the setting of the delay, it may produce a measurement error. The importance of the monotony will now be described referring to FIGS. 11 to 13.

The action of analyzing jitters with the test circuit and test method disclosed in Citation 1 will be explained in brief referring to FIG. 11. It is assumed that the monotony is guaranteed while FIG. 11 illustrates the setting of the delay along the horizontal axis which can be replaced by an actual delay. As the setting of the delay in the delay circuit is varied in steps, the timing of the rise of the output signal from the PLL circuit and the timing of the rise of a delay signal delayed one cycle from the output signal by the delay circuit are compared with each other by a phase comparator. For example, a result of the comparison when the timing of the rise of the output signal from the PLL circuit is later than the timing of the rise of the delay signal is counted by a meas counter to assign the setting of the delay with a count number. This action is schematically illustrated in FIG. 11. The point A represents the maximum of the setting of the delay when the timing of the rise of the output signal from the PLL circuit is earlier than the timing of the rise of a 100% delay signal regardless of the effect of jitter as is equal to the minimum Tmin of the delay of one cycle when a jitter is involved. The point C represents the minimum of the setting of the delay when the timing of the rise of the output signal from the PLL circuit is later than the timing of the rise of a 100% delay signal regardless of the effect of jitter as is equal to the maximum Tmax of the delay of one cycle when a jitter is involved. The point B between the two points A and C represents a state when the timing of the rise of the output signal from the PLL circuit is advanced or delayed from the timing of the rise of the delay signal because of the effect of jitter. Accordingly, the size of a jitter is calculated from a difference Tmax−Tmin of the delay between Tmin at the point A where the count is zero and Tmax at the point C where the count is 100%.

It is now necessary to identify the two points A and C in the two specific factors, the setting of the delay and the count. More specifically, as is explained referring to FIG. 12 where the points where the count is zero are three (A1, A2, and A3), the actual delay increases and shifts monotonously from A1 to A2, A3, B1, . . . in proportion to the elongation of the setting of the delay (shifted towards the lower in the drawing). When the actual delay arrives at the fourth point B1, the count exceeds zero and hence the point A3 prior to the point B1 is designated as the representative point A. Further, as the setting of the delay is elongated gradually, the actual delay increases monotonously and shifts from B1 to B4, B5, C1, C2, C3, and so on. From the point B1 to the point B5, the counter exceeds zero and remains lower than 100%. When the actual delay shifts from B5 to C1, the count reaches 100% and the point C1 is designated as the representative point C. Then, the jitter can be calculated from a difference between the point A3 and the point C1. Alternatively, the setting of the delay may gradually be shortened rather than elongated.

However, when the monotonous relationship between the setting of the delay and the actual delay is lost as shown in FIG. 13, both the points A and C shown in FIG. 11 may hardly be identified by a combination of the setting of the delay and the count. As shown in FIG. 13, the monotonous relationship is held from the point A1 to the point B4 but not from the point C1 to the point C4. As the setting of the delay has gradually been elongated, the count becomes 100% at the point C4. Accordingly, the point C4 may be designated as the representative point C which is duly at the point C1. This will overestimate the effect of jitter. As clarified, the algorithm for the analyzing action is fractured when the monotonous relationship is lost between the setting of the delay and the actual delay and will thus fail to proceed the correct measurement.

(3) The duty error will increase when a difference of the delay between the rise signal and the fall signal in the delay circuit is great. It is needed for measuring the effect of jitter, as shown in FIG. 11, to calculate the actual delays from the settings of the delay at the points A and C. More particularly, the oscillation cycle T in the delay circuit acting as a ring oscillator is first calculated and used for determining a length of the desired delay. Since the ring oscillator is constructed by the variable delay circuit and the single inverter as shown in FIG. 14, the duration Th at the high level of the voltage waveform of the signal at the output port OUT of the variable delay circuit represents the delay T2 in the fall of the input signal at the input port IN because the single inverter inverts the signal level. Also, the duration Tl at the low level of the voltage waveform of the signal at the output port OUT of the variable delay circuit represents the delay T1 in the rise of the input signal at the input port IN. It is hence found that the oscillation cycle T is equal to a sum (T1+T2) of the delay T1 in the rise signal and the delay T2 in the fall signal. More particularly, if the delay circuit has non-symmetrical relationship during the signal transition, the duty ratio in the ring oscillator may hold not 1:1 or turn to T1≠T2. In brief, the delay T1 or T2 will not straightforwardly be determined from the oscillation cycle T. However, the actual delay from the setting of the delay at each of the points A and C has to be either T1 or T2. Assuming that T1=T2 is given for convenience, the delay T1 or T2 is then calculated as ½ the oscillation cycle T in the ring oscillator. As the result, the difference of the delay between the rise signal and the fall signal in the delay circuit will create an error of |T1−T2|/2 between the actual delays at the two points A and C.

SUMMARY

The technology presented herein has been developed in view of the foregoing drawbacks and its object is to provide a test circuit which can examine the timing of jitters in the clock signal produced by a PLL circuit at higher resolution and higher accuracy.

For achievement of the above feature of the technology presented herein, a test circuit is provided as a first feature which includes a delay circuit whose delay can be controlled, a phase comparator circuit for comparing the phases between a clock signal to be examined and a delay clock signal delayed from the clock signal by the delay circuit, a meas counter for counting the number of outputs of the prescribed comparison result from the phase comparator circuit, a signal switching circuit for switching the input signal to be received by the delay circuit from the clock signal to a delay signal which satisfies the oscillation condition in which the delay signal is received from the delay circuit thus to develop a ring oscillator, and a frequency measuring circuit for measuring the oscillation frequency when the ring oscillator has been developed by the signal switching circuit, wherein the delay circuit includes a variable delay circuit which has a plurality of variable delay units connected in series so that the delay in each of the variable delay units can be controlled independently.

According to the first feature, the clock signal to be examined and the delay clock signal are compared in the phase from each other by the phase comparator circuit from which the number of outputs of the prescribed comparison result is counted by the meas counter. This allows each delay to be correctly calculated when the count from the meas counter for identifying jitters in the clock signal is zero at the point where the setting of the delay is maximum and when the count is 100% at the point where the setting of the delay is minimum. Accordingly, the timing of the clock signal can be examined at higher resolution and higher accuracy. For calculating the actual delay from the setting of the delay, the ring oscillator is developed in the delay circuit by the switching action of the signal switching circuit and its oscillation frequency is measured for determining the delay. It is necessary for promoting the oscillating action of the ring oscillator to develop an odd number of the inverter circuits along the oscillation path which extends one circle throughout the ring oscillator. If the delay circuit is implemented with an even number of stages, at least one inverter circuit is needed between the output of the delay circuit and the signal switching circuit. When the delay circuit includes an odd number of stages, no extra inverter will be needed.

More specifically, while the delay circuit includes the variable delay circuit which has a number of the variable delay units connected in series, the delay can be controlled at either each or a group of the variable delay units. Since the resolution of the whole delay circuit is based on the controllable length of the delay at one or more of the variable delay units, it can be improved as compared with the resolution in a prior art delay circuit which is determined by the gate delay. For example, when the delay is controlled in two levels, large and small, in the variable delay units, the resolution can be expressed by a difference between the large delay and the small delay. Accordingly, the resolution in an exemplary embodiment presented herein will be higher than that of the prior art where the delay of the variable delay unit affects directly on the resolution.

Moreover, as the variable delay units having an identical circuitry arrangement are connected in series in the variable delay circuit regardless of the setting of the delay, the clock signal received by the delay circuit is passed through all the variable delay units and its signal path remains thus uniform in the length. As the result, the monotonous relationship between the setting of the delay and the actual delay can be guaranteed thus ensuring the linearity.

The test circuit according to an exemplary embodiment may also be modified as a second feature in which the variable delay units are arranged to selectively determine the delay from two or more alternatives.

According to the second feature, the delays of the variable delay units are determined discretely and can thus be controlled with the use of logic signals. This allows the control circuit for determining the setting of the delay to be implemented by a logic circuit. In this case, the test resolution is determined by a difference between two or more of the delays.

The test circuit according to an exemplary embodiment may be modified as a third feature in which the variable delay unit includes a pair of inverter circuits connected in series and each inverter circuit has a controllable element of which the current drive capability is controlled.

According to the third feature, each of the two inverter circuits connected in series in the variable delay unit can be controlled in the current drive capability in the same way thus eliminating the duty error. More specifically, the delay can be adjusted precisely or substantially equal between the rise signal and the fall signal received by each variable delay unit, hence having the two signals in the delay circuit arranged precisely or substantially equal in the delay. As the result, during the measurement of the actual delay in relation to an arbitrary setting of the delay, the oscillation frequency of the ring oscillator remains held at precisely or substantially 50% of the duty ratio. Since the delay is calculated at higher accuracy, the timing of the clock signal can be examined at higher accuracy.

The test circuit of the third feature may further be modified as a fourth feature in which the controllable element is a MOSFET and the current drive capability of the controllable element is controlled with its gate input voltage.

Also, the test circuit of the third feature may further be modified as a fifth feature in which the controllable element is a MOSFET and the current drive capability of the controllable element is controlled with its back gate voltage.

The test circuit of any of the third to fifth features may be modified as a sixth feature in which the inverter circuit includes two or more of the controllable elements.

The test circuit of any of the third to sixth features may be modified as a seventh feature in which the current drive capability of the controllable element in each inverter circuit is controlled at multiple levels by a control signal having three or more digit levels.

The test circuit of any of the third to sixth features may be modified as an eighth feature in which the current drive capability of the controllable element in each inverter circuit is controlled at two levels by a binary control signal.

The test circuit of any of the third to eighth features may be modified as a ninth feature in which the controllable element is an n-channel MOSFET.

According to any of the fourth to ninth features, the delay circuit can be improved in the resolution and the monotony as well as increased to 50% in the duty ratio.

According to the sixth or seventh feature, the delay of the variable delay unit can be controlled at multiple levels, thus allowing the whole delay circuit to ensure a variable length of the delay with the use of a less number of the variable delay units.

The test circuit of any of the preceding features may be modified as a tenth feature in which it is mounted on a single substrate together with a clock generating circuit for generating the clock signal to be examined.

According to the tenth feature, the test circuit and the clock generating circuit are assembled together as an LSI chip thus developing a BIST circuit. As the result, the test circuit can perform a built-in self-operating test with no use of any external measuring means, hence improving the accuracy of its measurement.

A clock generating circuit according to an exemplary embodiment is provided for generating a clock signal using a PLL circuit and characterized in that all or a part including at least the delay circuit of the test circuit defined in any of the first to ninth features for testing the clock signal is included.

Since the clock generating circuit includes all or a part including at least the delay circuit of the test circuit defined in any of the first to ninth features for testing the clock signal, its clock signal can be examined in the timing at higher resolution and higher accuracy by virtue of the advantages of the test circuit of any of the first to ninth features.

An image sensor according to an exemplary embodiment is provided including an optical sensor, a storing means for storing a data output of the optical sensor, a transmitting means for transmitting the data output stored in the storing means, and a clock generating circuit for generating clock signals to control each action of the optical sensor, the storing means, and the transmitting means, wherein the clock generating circuit for generating a clock signal to control at least the action of the transmitting means is the clock generating circuit of the preceding feature.

Since the clock generating circuit in the image sensor for generating a clock signal to control at least the action of the transmitting means includes all or a part including at least the delay circuit of the test circuit of any of the first to ninth features, its clock signal can be examined in the timing at higher resolution and higher accuracy by virtue of the advantages of the test circuit of any of the first to ninth features. Eventually, the image sensor can be examined in the performance at higher resolution and higher accuracy.

A delay circuit whose delay can be controlled according to an exemplary embodiment is also provided as a first feature and characterized by a variable delay circuit which has a plurality of variable delay units connected in series. The delay can hence be determined at each or a group of the variable delay units independently.

Since the delay circuit of the first feature is arranged in which the variable delay units in the variable delay circuit are connected in series and their delay can hence be determined at each or a group of the variable delay units separately, the resolution of the whole delay circuit can be determined by a controllable length of the delay in each variable delay unit. Accordingly, the resolution will be improved as compared with that of the prior art delay circuit of which the delay element is based on the gate delay. For example, when the delay is controlled in two levels, large and small, in the variable delay units, the resolution can be expressed by a difference between the large delay and the small delay. Accordingly, the resolution in the exemplary embodiment presented herein will be higher than that of the prior art where the delay of the variable delay unit affects directly on the resolution.

Moreover, as the variable delay units having an identical circuitry arrangement are connected in series in the variable delay circuit regardless of the setting of the delay, the clock signal received by the delay circuit is passed through all the variable delay units and its signal path remains thus uniform in the length. As the result, the monotonous relationship between the setting of the delay and the actual delay can be guaranteed thus ensuring the linearity.

The delay circuit of the first feature may also be modified as a second feature in which the variable delay units are arranged to selectively determine the delay from two or more alternatives.

According to the delay circuit of the second feature, the delays of the variable delay units are determined discretely and can thus be controlled with the use of logic signals. This allows the control circuit for determining the setting of the delay to be implemented by a logic circuit. In this case, the resolution of the delay is determined by a difference between two or more of the delays.

The delay circuit of the first or second feature may be modified as a third feature in which the variable delay unit includes a pair of inverter circuits connected in series and each inverter circuit has a controllable element of which the current drive capability is controlled.

According to the delay circuit of the third feature, each of the two inverter circuits connected in series in the variable delay unit can be controlled in the current drive capability in the same way. This allows the delay to be adjusted precisely or substantially equal between the rise signal and the fall signal received by each variable delay unit, hence having the two signals in the delay circuit arranged precisely or substantially equal in the delay.

BRIEF DESCRIPTION OF THE DRAWINGS

FIG. 4 is a table showing the relationship between a setting signal for setting the delay and the delay of each of 63 variable delay units in the delay circuit of the another embodiment;

DETAILED DESCRIPTION

Some embodiments of a test circuit according to the technology presented herein (referred to as an inventive circuit hereinafter) will be described referring to the relevant drawings.

First Embodiment

Figure 1:
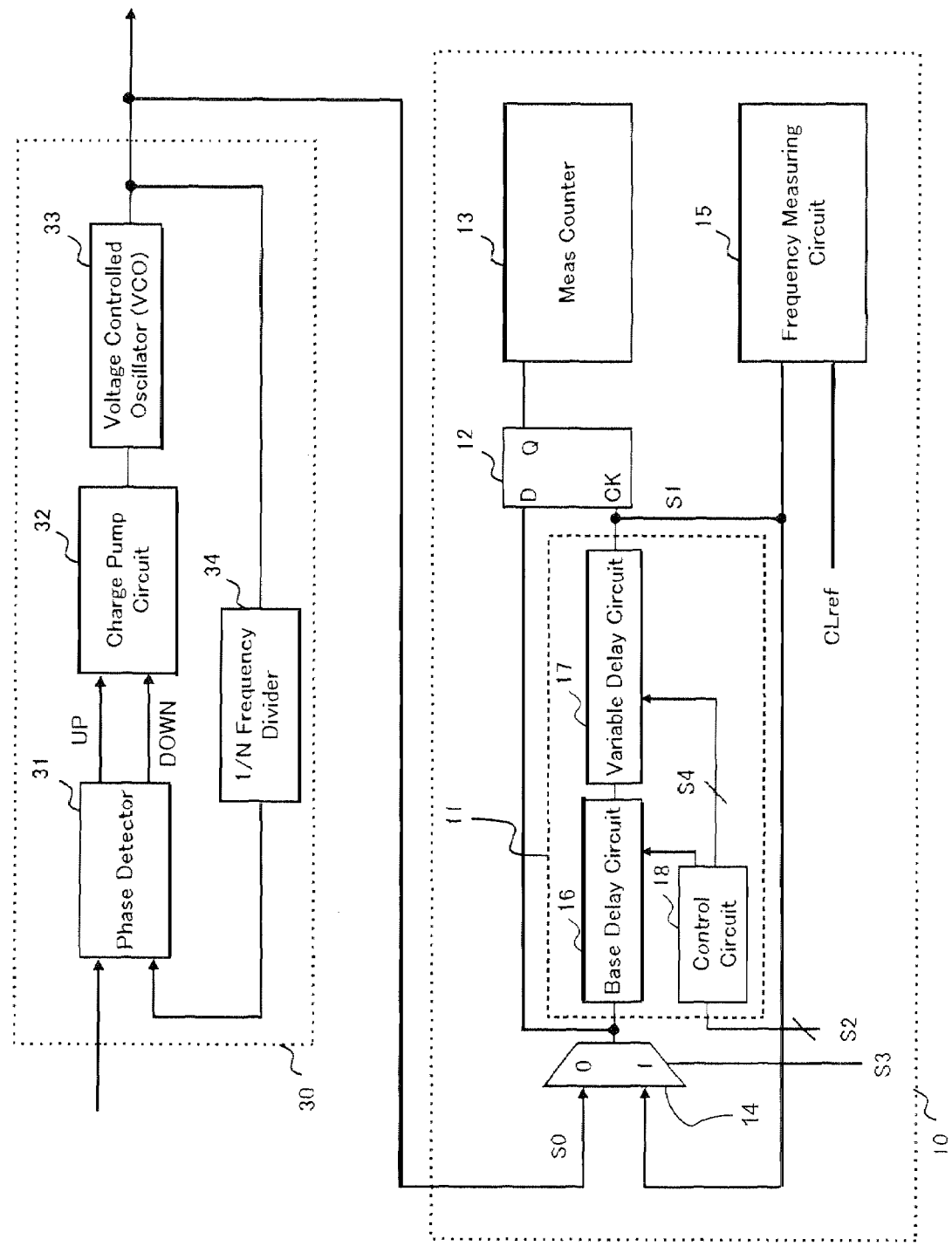
FIG. 1 is a block diagram showing a schematic block arrangement of a test circuit of one embodiment together with a clock generating circuit for generating a clock signal to be examined.

FIG. 1 is a block diagram showing a circuitry arrangement of the circuit 10 according to an exemplary embodiment and a circuitry arrangement of a clock generating circuit 30 which is implemented by a PLL circuit for generating a clock signal S0 to be examined by the circuit 10. It is assumed that the circuit 10 and the clock generating circuit 30 of this embodiment are assembled on a single semiconductor substrate and encapsulated in an LSI chip.

As shown in FIG. 1, the circuit 10 includes a delay circuit 11 according to the exemplary embodiment, a phase comparator circuit 12, a measuring counter 13, a signal switching circuit 14, and a frequency measuring circuit 15.

Figure 2:
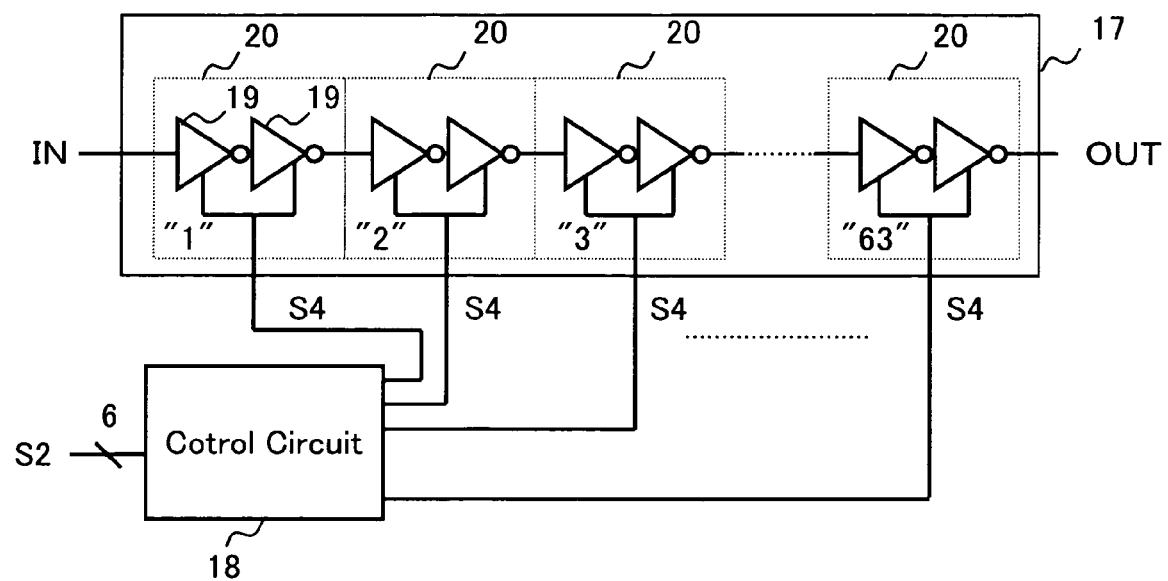
FIG. 2 is a circuitry diagram showing a circuitry arrangement of a variable delay circuit in a delay circuit of another embodiment.

The delay circuit 11 represents a specified portion of the circuit 10 which includes a base delay circuit 16, a variable delay circuit 17, and a control circuit 18. The variable delay circuit 17 has a significant circuitry arrangement. As shown in FIG. 2, the variable delay circuit 17 has 63 variable delay units 20, each consisting of two inverter circuits 19, connected in series. The inverter circuit 19 is a logic gate for inverting the level of an input signal before releasing out. The inverters 19 in the variable delay units 20 are identical in the arrangement where a controllable device is contained for controllably varying its current drive capability, whereby the delay determined by the variable delay units 20 can alternatively be selected from two or more discrete delay periods. The inverter circuit 19 will be described later in more detail. The control circuit 18 is arranged responsive to a setting signal S2 from the outside for controlling the actions of the base delay circuit 16 and the variable delay circuit 17 to determine desired settings of the delay.

It is assumed that when the delay determined by the variable delay unit 20 is a minimum setting (Tf), the delay of the variable delay circuit 17 is 63×Tf. Then, as a sum, Tb+63×Tf, of the delay Tb of the base delay circuit 16 and the delay 63×Tf is designated as the base delay of the delay circuit 11, it is set to a duration shorter than a full cycle or a half the cycle of the clock signal to be examined. It is preferable for switching the full cycle or the half the cycle to control the delay Tb of the base delay circuit 16 with a control signal of the control circuit 18.

The phase comparator circuit 12 is provided for comparing between the phase of a clock signal S0 to be examined and a delay clock signal S1 delayed from the clock signal S0 by the delay circuit 11 and implemented by a D type flip-flop in this embodiment. More particularly, the D type flip-flop is arranged to receive the clock signal S0 at its data input port D and the delay clock signal S1 at its clock input port CK while its data output port Q is connected to the input of the measuring counter 13. This allows the D type flip-flop 12 to examine the timing relation between the rising edge or falling edge of the clock signal S0 and the rising edge or falling edge of the delay clock signal S1, depending on the fact that the delay clock signal S1 is delayed from the clock signal S0 by one full cycle or a half the cycle, and latch a result of the examination in the form of a data digit 0 or 1 synchronized with the delay clock signal S1 before releasing it from the data output port Q.

The measuring counter 13 is provided for counting the number of the data digits (for example, 1s) judged by the phase comparator circuit 12 comparing in the phase between two signals a predetermined number of times (for example, several tens of thousands) for each of the settings of the delay which are shifted one another with time at the jitter measuring mode.

The signal switching circuit 14 is provided for switching between the jitter measuring mode and the ring oscillating mode in response to a mode switching signal S3 received from the outside. In the jitter measuring mode, the clock signal S0 is selected from the two input signals and transmitted to the delay circuit 11 and the meas counter 13. In the ring oscillating mode, the delay clock signal S1 received from the delay circuit 11 is selected and transmitted to the delay circuit 11 and the meas counter 13. The delay circuit 11 in this embodiment is arranged with the number of the inverter units set to an odd number along the signal path in the delay circuit 11 for acting as a ring oscillator which satisfies the requirements of oscillation. In case that the number of the inverter units along the signal path in the delay circuit 11 is an even number, the delay clock signal S1 may be inverted in the signal level by a separate inverter circuit (not shown) before fed to the signal switching circuit 14.

The frequency measuring circuit 15 is provided for measuring the oscillation frequency of the ring oscillator determined at the ring oscillating mode by the signal switching circuit 14 when the delay circuit 11 is set with a desired setting of the delay. From measurements of the oscillation frequency, the actual delay can be calculated in relation to the setting of the delay determined at the jitter measuring mode.

The variable delay unit 20 will now be described in more detail. The delay of the variable delay unit 20 in this embodiment is set to either of two delays Tf or Ts (Tf<Ts) according to a control signal S4 produced by decoding the setting signal S2 from the control circuit 18. A difference |Ts−Tf| between the two delays Tf and Ts represents the test resolution of the inventive circuit. Accordingly, each of the inverter circuits 19 in the variable delay unit 20 can thus be set with two alternatives of the delay.

Figure 3:
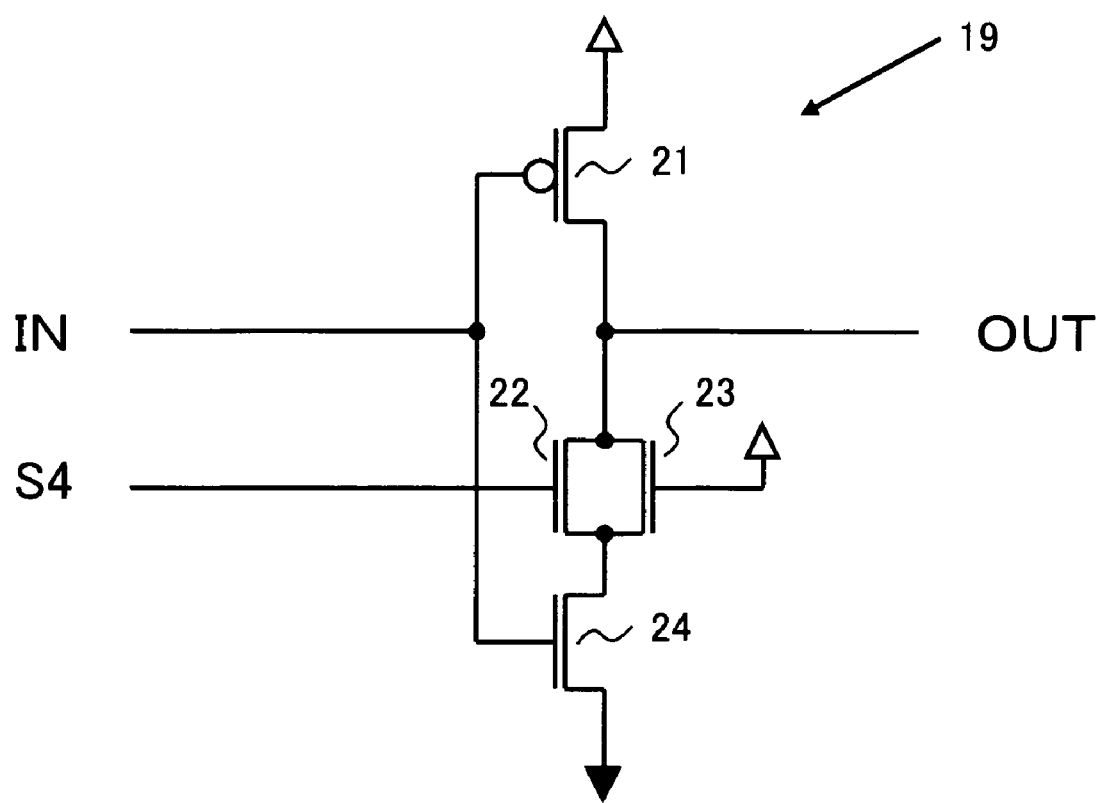
FIG. 3 is a circuitry diagram showing a circuitry arrangement of an inverter circuit in the delay circuit of the another embodiment.

More specifically, the inverter circuit 19 may include a p-channel MOSFET 21 (referred to as PMOS hereinafter) and three n-channel MOSFETs 22 to 24 (referred to as NMOSs hereinafter), as shown in FIG. 3. The PMOS 21 is connected at the gate to the input port IN of the inverter circuit 19, at the source to a power source, and at the drain to the output port OUT of the inverter circuit 19. The two NMOSs 22 and 23 are connected at the drain to the output port OUT of the inverter circuit 19 and at the source to the drain of the NMOS 24. The gate of the NMOS 22 is connected with the control signal S4 from the control circuit 18 while the gate of the NMOS 23 is connected with the power source. The NMOS 24 is connected at the gate to the input port IN of the inverter circuit 19, at the source to the ground, and at the drain to the sources of the NMOSs 22 and 23. The NMOS 22 is arranged to function as a controllable element of which the current drive capability is controlled by the control circuit 18. In action, the NMOS 22 is turned on when the control signal S4 is at a high level (for example, equal to the source voltage level) and off when at a low level (for example, equal to the grounding level). It is now assumed that, when the control signal S4 is at the high level, the delay from the rise of the input signal in each inverter circuit 19 is Trh and the delay from the fall of the input signal is Tfh and, when the control signal S4 is at the low level, the delay from the rise of the input signal in each inverter circuit 19 is Trl and the delay from the fall of the input signal is Tfl. As the current drive capability at the discharge side from the output port is increased with the high level of the control signal S4, the fall time at the output port becomes shorter and the input signal at the rise time will be specified with Trh<Trl. As the inverted level in the inverter circuit 19 at the high level of the control signal S4 is equal to or lower than that at the low level depending on the capability of the NMOSs 22 and 23, the input signal at the fall time will be specified with Tfh≧Tfl. However, the NMOS 22 is installed as the controllable device at the side of declining the voltage at the output port OUT and will significantly affect the rise time of the input signal while never or hardly interrupting the fall of the input signal. As the result, the difference (Trl−Trh) of the delay in the rise time of the input signal is greater than the difference (Tfh−Tfl) of the delay in the fall time of the input signal as expressed below in Equation 1.

$$(Trl-Trh) > (Tfh-Tfl) \quad \text{(Equation 1)}$$

The delay of the variable delay circuit 20 including the two stage inverter circuits 19 is Trh+Tfh at either the rise time or the fall time of the input signal when the control signal S4 is at the high level. When the control signal S4 is at the low level, the delay is Trl+Tfl at either the rise time or the fall time of the input signal. As expressed in Equation 2, which is derived from Equation 1, the delay Trh+Tfh when the control signal S4 is at the high level is shorter than the delay Trl+Tfl when the control signal S4 is at the low level. Accordingly, the two alternatives Tf and Ts of the delay in the variable delay unit 20 are as expressed in Equation 3.

$$(Trl+Tfl)>(Trh+Tfh) \qquad \text{(Equation 2)}$$

$$Tf=Trh+Tfh$$

$$Ts=Trl+Tfl \qquad \text{(Equation 3)}$$

Assuming that the number of the variable delay units 20 set with the delay Ts is n (n=0 to 63), the total delay Td of the delay circuit 11 is expressed by:

$$Td=Tb+(63-n) \times Tf + n \times Ts \qquad \text{(Equation 4)}$$

The delay circuit 11 including the variable delay circuit 17 shown in FIG. 2 will further be described for (1) resolution, (2) monotony, and (3) duty error.

The description starts with the resolution. As the difference |Ts−Tf| of the delay in each variable delay unit 20 is provided as the resolution, it can be adjusted to a desired setting by modifying either the setting of the current drive capability (on resistance) when the NMOS 22 in the inverter circuit 19 shown in FIG. 3 remains turned on or the voltage when the control signal S4 is at the high level. Since the difference (Trl−Trh) of the delay in the inverter circuit 19 at the rise time of the input signal is adjustable to 20 ps or shorter, the resolution |Ts−Tf| can equally be modified to 20 ps or shorter. It is essential for the circuit that the resolution is minimized as determined by the difference |Ts−Tf| of the delay even when the delays Ts and Tf are rather extensive. On the other hand, when the resolution is determined directly by the delay in the variable delay unit 20, it largely depends on the manufacturing accuracy during the production process of the variable delay unit 20 and will hardly be set to 20 ps or shorter.

The monotony will be explained. As the variable delay circuit 17 including 63 of the variable delay units 20 connected in series, the clock signal S0 received by the delay circuit 11 passes through all the 63 variable delay units 20 uniformly regardless of the (delay setting) mode of the control signal S4. Accordingly, the signal path remains uniform but not changed by the setting of the delay, thus permitting the delay of the variable delay circuit 17 to be modified depending on a shift in the delay of each variable delay unit 20.

In this embodiment, the delay of the variable delay unit 20 is selected and predetermined from the two, early and late, a alternatives Tf and Ts by the control signal S4. For example, the delay in all the variable delay units 20 can be shifted from the early setting Tf to the late setting Ts in a sequence from the front closest to the input side. Accordingly, when the setting of the delay is increased, the actual delay will increase thus ensuring the monotonous relationship between the setting of the delay and the actual measurement of the delay. FIG. 4 illustrates the relationship between a hexadecimal code form of the setting signal S2 to be decoded to the control signal S4 and the delay in each of the 63 variable delay units 20. The numerals at the rightmost column of the table in FIG. 4 represent examples of the total delay Td of the delay circuit 11 where the resolution is equal to 20 ps.

The duty error will be explained. As shown in FIG. 2, the variable delay unit 20 includes a pair of the inverter circuits 19 which are identical in the circuitry arrangement to each other. Accordingly, four different settings Trh, Tfh, Trl, and Tfl of the delay in the inverter circuit 19 are equal. When the control signal S4 is at the high level, the delay of the variable delay unit 20 including the two stage inverter circuits 19 is Trh+Tfh at either the rise time or the fall time of the input signal. When the control signal S4 is at the low level, the delay of the variable delay unit 20 is Trl+Tfl at either the rise time or the fall time of the input signal. Therefore, the delay at the rise time of the input signal and the delay at the fall time of the input signal are equal to each other regardless of the (delay setting) mode of the control signal S4. As the result, the oscillation cycle T of the ring oscillator determined at the ring oscillation mode by the signal switching circuit 14 is substantially two times greater than the total delay Td of the delay circuit 11. This allows the actual delay to be calculated by dividing the oscillation cycle T by two as being deviated by a minimum of the duty error from the prescribed setting of the delay.

Finally, the circuitry arrangement of the clock generating circuit 30 shown in FIG. 1 will be explained in brief. The clock generating circuit 30 includes a common PLL circuit which includes a phase detector 31, a charge pump circuit 32, a voltage controlled oscillator (VCO) 33, and a 1/N frequency divider 34. The phase detector 31 is provided for detecting a difference in the phase between the reference clock signal CL0 and a signal produced by dividing the output signal S0 of the VCO 33 by N with the 1/N frequency divider 34 and controlling the voltage output of the charge pump circuit 32 with the difference. The VCO 33 is provided for modifying the oscillation frequency in response to the voltage output of the charge pump circuit 32 and producing the output signal S0 through multiplying the frequency of the reference clock signal CL0 by N.

Second Embodiment

Figure 5:
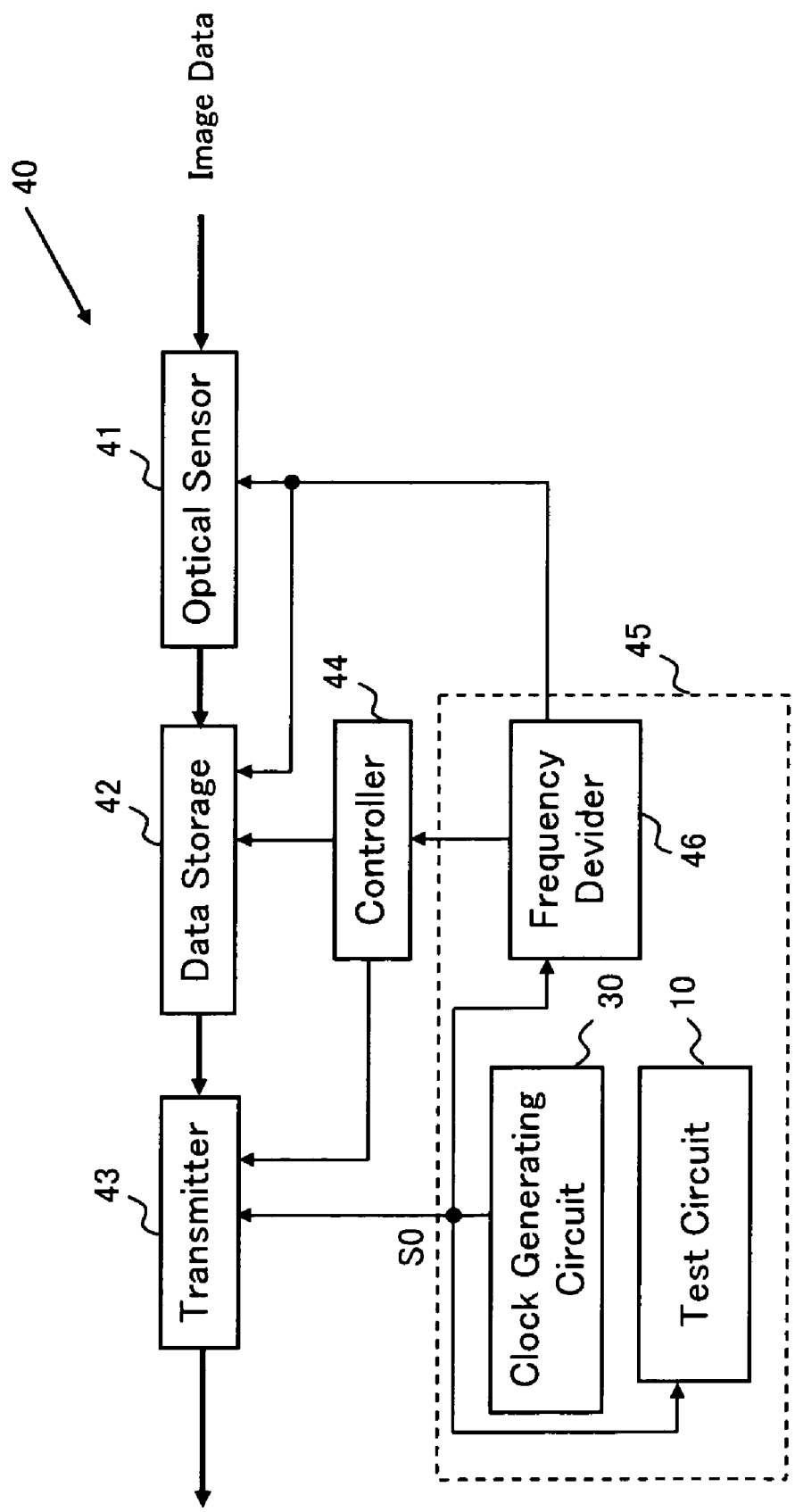
FIG. 5 is a block diagram showing a schematic block arrangement of an image sensor of a further embodiment.

The second embodiment will be described in the form of an image sensor 40 which employs the circuit 10 of the first embodiment. As shown in FIG. 5, the image sensor 40 according to the present invention includes an optical sensor 41 for measuring optical data of a one-dimensional or two-dimensional image, a data storage 42 for temporarily storing a data output of the optical sensor 41, a transmitter 43 for converting the output data stored in the data storage 42 into a serial data for high-speed transmission, a controller 44 for controllably synchronizing the action of the data storage 42 with the action of the transmitter 43, and a clock generating circuit 45 for producing and distributing clock signals to the optical sensor 41, the data storage 42, the transmitter 43, and the controller 44 respectively. The optical sensor 41, the data storage 42, the transmitter 43, the controller 44, and the clock generating circuit 45 in this embodiment are assembled together on a single semiconductor substrate and provided as one LSI chip.

The data storage 42 is a semiconductor memory such as SRAM while the transmitter 43 is implemented by a high-speed interface such as LVDS (low voltage differential signaling) for transmitting the serial data at high speeds. The cycle of the action of writing and reading of data on the data storage 42 is set later than the cycle of the transmission of data from the transmitter 43 because the data is of a parallel mode.

The clock generating circuit 45 includes a clock generator 30 which is a PLL circuit for generating the high-speed clock signal S0 to be received by the transmitter 43, a frequency divider 46 for dividing the frequency of the high-speed clock signal S0 received from the clock generator 30 and distributing the divided signal to an optical sensor 41, a data storage 42, and a controller 44, and the inventive circuit 10 of the first embodiment (equal to the test circuit of the present invention). The clock generator 30 is identical in the circuitry arrangement to the clock generating circuit 30 of the first embodiment and will be explained in no more detail.

Since this embodiment allows the accuracy of timing of the high-speed clock signal provided for transferring serial data from the transmitter 43 to be examined at higher resolution and accuracy by the circuit 10 in the clock generating circuit 45, its image sensor can be improved in the quality with no significant interruption in its image.

Further embodiments will be described.

Figure 6:
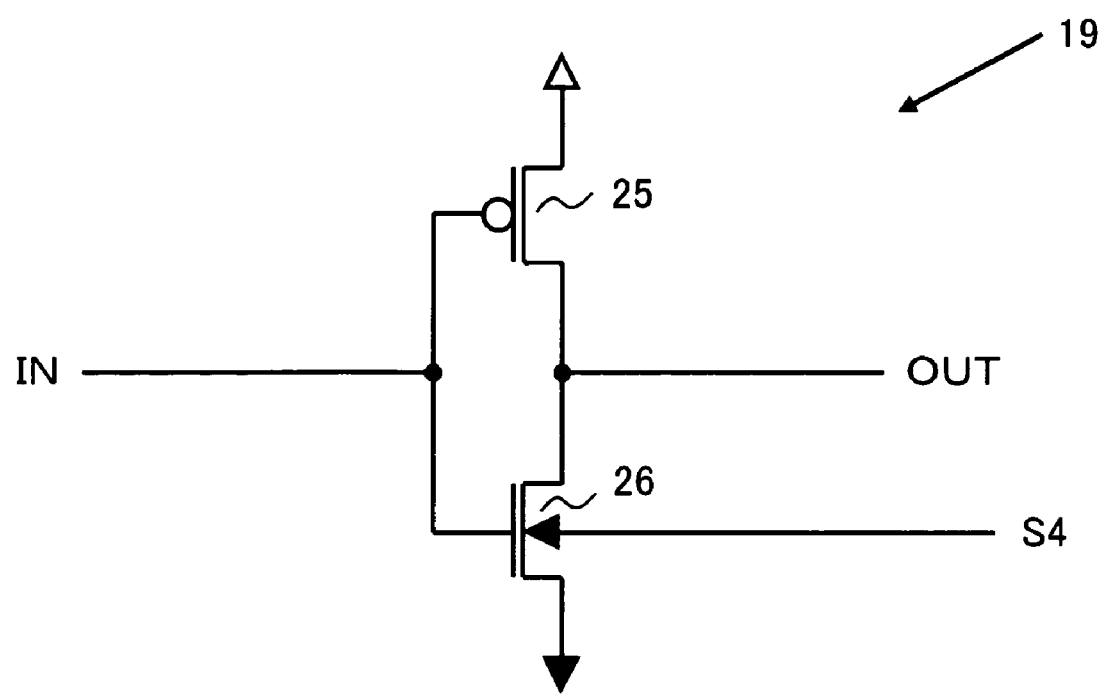
FIG. 6 is a circuitry diagram showing a modification (second circuitry arrangement) of the inverter circuit in the delay circuit of the another embodiment.

(1) A second arrangement of the inverter circuit 19 in the variable delay unit 20 is provided. The inverter circuit 19 of the first embodiment includes, in addition to a pair of the PMOS 21 and the NMOS 24, the NMOS 22, which is turned on and off by the control signal S4, and the NMOS 23, which remains turned on, connected in parallel between the PMOS 21 and the NMOS 24. Instead of including the NMOSs 22 and 23, the NMOS 24 may be replaced by a controllable element which can control its current drive capability with the control signal S4. For example, the controllable element is implemented by a pair of PMOS 25 and NMOS 26 as shown in FIG. 6. The PMOS 21 is connected at the gate to the input port IN of the inverter circuit 19, at the source and back gate to the source voltage, and at the drain to the output port OUT of the inverter circuit 19. The NMOS 26 is connected at the gate to the input port IN of the inverter circuit 19, at the source to the ground, at the drain to the output port OUT of the inverter circuit 19, and the back gate to the control signal S4 from the control circuit 18. As the control signal S4 is shifted from the grounding level (0 V) to a prescribed positive voltage level, the actual threshold voltage of the NMOS 26 increases substantially in proportion to the square root of a change in the back gate potential of the NMOS 26 thus declining the current drive capability of the NMOS 26. This permits the NMOS 26 to act as the controllable element which can control the current drive capability with the signal from the control circuit 18.

It is now assumed that, when the control signal S4 is at the high level, the delay from the rise of the input signal in each inverter circuit 19 is Trh' and the delay from the fall of the input signal is Tfh' and, when the control signal S4 is at the low level, the delay from the rise of the input signal in each inverter circuit 19 is Trl' and the delay from the fall of the input signal is Tfl'. As the threshold voltage of the NMOS 26 is increased higher with the high level of the control signal S4 than the low level to elevate the current drive capability at the side of discharging from the output port, the inversion level of the inverter circuit 19 will increase and simultaneously the fall time at the output port becomes longer. The input signal will hence be specified with Trh'>Trl' at the rise time and Tfh'<Tfl' at the fall time. However, the PMOS 25 remains unchanged in the current drive capability at the side discharging from the output port. Accordingly, any change in the threshold voltage of the NMOS 26 will significantly affect the rise time of the input signal. As the result, the difference (Trh'−Trl') of the delay in the rise time of the input signal is greater than the difference (Tfl'−Tfh') of the delay in the fall time of the input signal as expressed below in Equation 5.

$$(Trh'-Trl')>(Tfl'-Tfh') \quad \text{(Equation 5)}$$

The delay of the variable delay circuit 20 including the two stage inverter circuits 19 is Trh'+Tfh' at either the rise time or the fall time of the input signal when the control signal S4 is at the high level. When the control signal S4 is at the low level, the delay is Trl'+Tfl' at either the rise time or the fall time of the input signal. As expressed in Equation 6, which is derived from Equation 5, the delay Trh'+Tfh' when the control signal S4 is at the high level is longer than the delay Trl'+Tfl' when the control signal S4 is at the low level. Accordingly, the two alternatives Tf and Ts of the delay in the variable delay unit 20 are as expressed in Equation 7.

$$(Trh'+Tfh')>(Trl'+Tfl') \quad \text{(Equation 6)}$$

$$Tf=Trl'+Tfl'$$

$$Ts=Trh'+Tfh' \quad \text{(Equation 7)}$$

Figure 7:
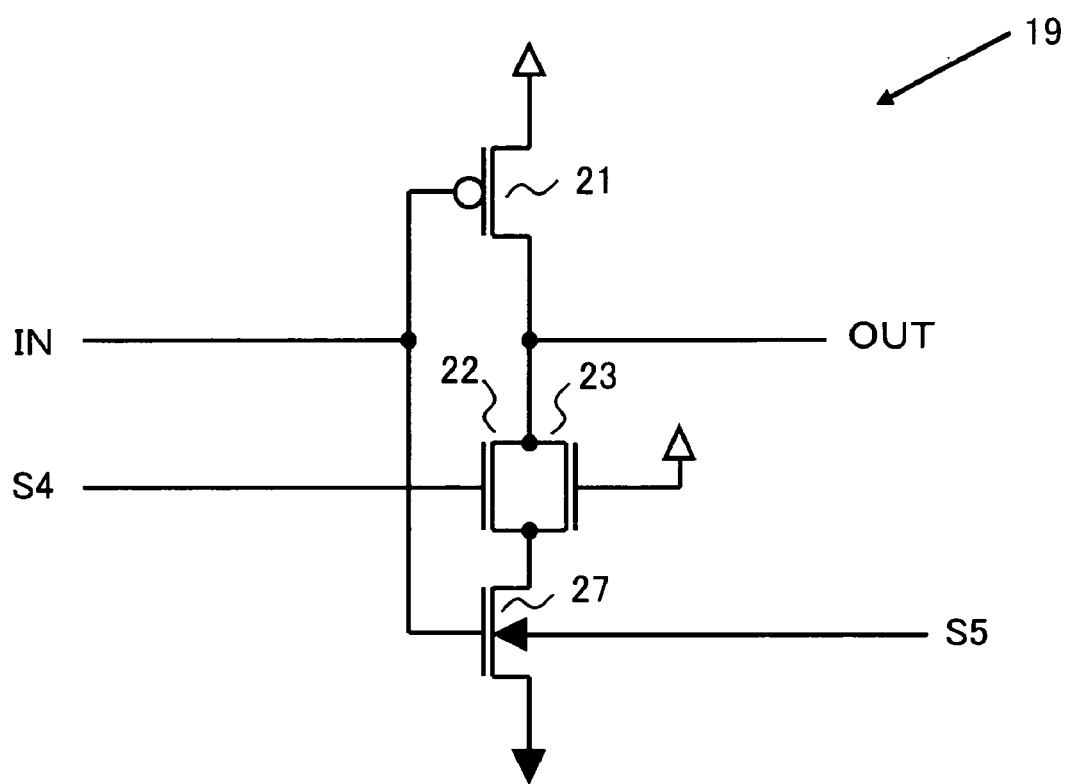
FIG. 7 is a circuitry diagram showing another modification (third circuitry arrangement) of the inverter circuit in the delay circuit of the another embodiment.

(2) A third arrangement of the inverter circuit 19 in the variable delay unit 20 will be explained. The third arrangement of the inverter circuit 19 is adapted, as shown in FIG. 7, in which the NMOS 24 of the first arrangement of the first embodiment shown in FIG. 3 is replaced by an NMOS 27 of which the back gate potential can be controlled with the level of a control signal S5. The third arrangement is a combination of the first arrangement shown in FIG. 3 and the second arrangement shown in FIG. 6. The current supply capabilities of the two controllable elements NMOS 22 and NMOS 27 in the third arrangement are controllably determined by two discrete control signals S4 and S5 respectively which have been produced through decoding the setting signal S2. As the result, the delay can be modified to desired lengths at higher accuracy.

(3) The controllable element in the inverter circuit 19 is implemented by the NMOS connected between the output port and the ground in the first embodiment or each of the second and third arrangements (1) and (2), but it is not limited to the NMOS. For example, the controllable element may be a PMOS connected between the output port and the ground while the circuitry arrangement is provided of a complimentary form.

(4) In the first embodiment or each of the second and third arrangements (1) and (2), the control signals S4 and S5 to be received by the controllable element or NMOS in the inverter circuit 19 have two digit levels for controllably determining the current drive capability of each controllable element at two different levels. Alternatively, the control signal S4 may have three or more digit levels for controllably determining the current drive capability at multiple levels.

Figure 8:
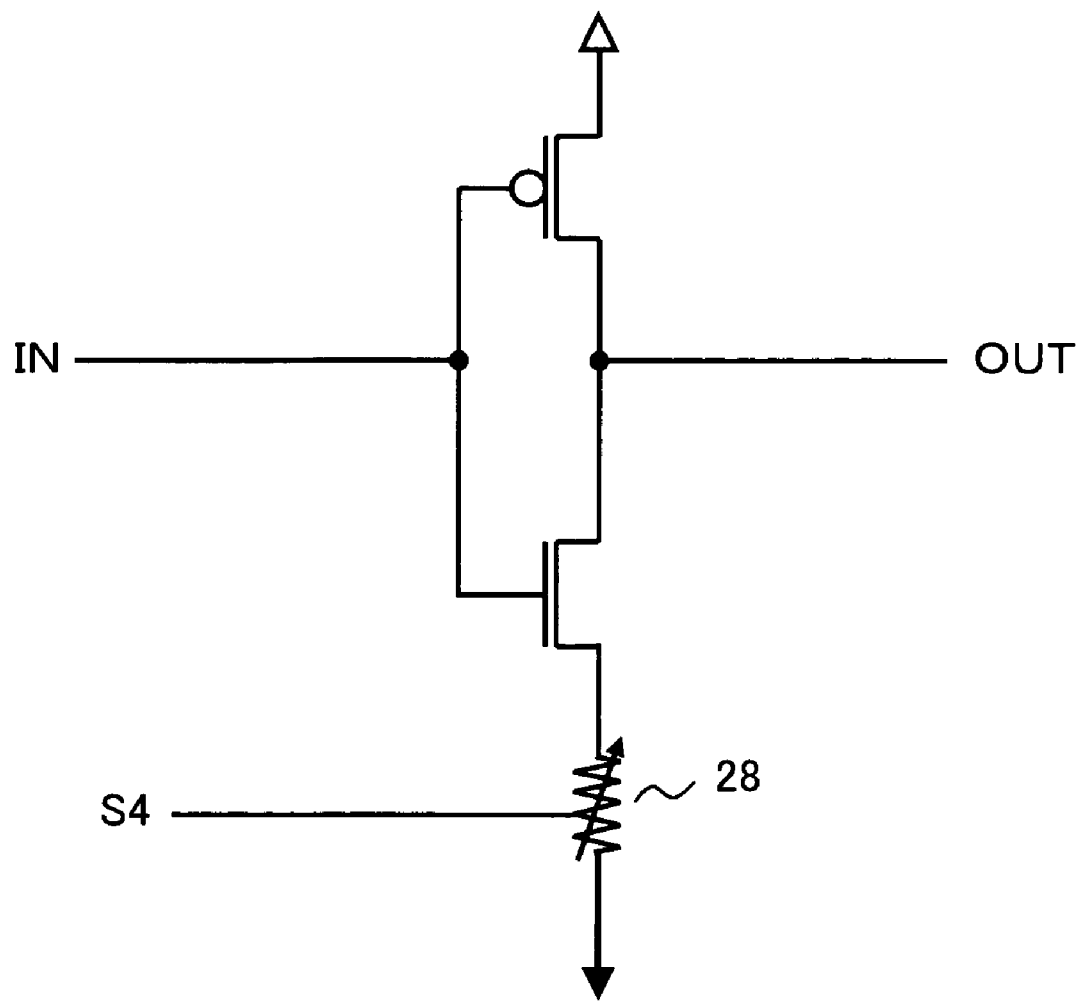
FIG. 8 is a circuitry diagram showing a further modification (fourth circuitry arrangement) of the inverter circuit in the delay circuit of the another embodiment.
Figure 9:
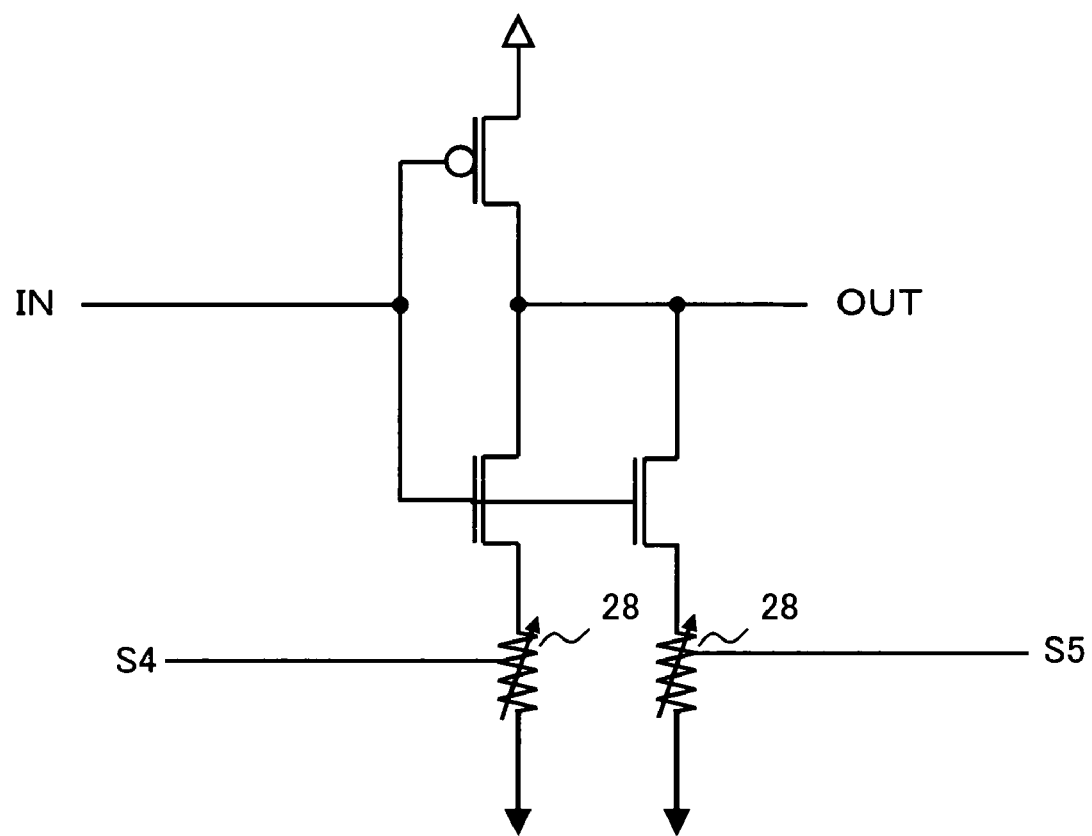
FIG. 9 is a circuitry diagram showing a still further modification (fifth circuitry arrangement) of the inverter circuit in the delay circuit of the another embodiment.
Figure 10:
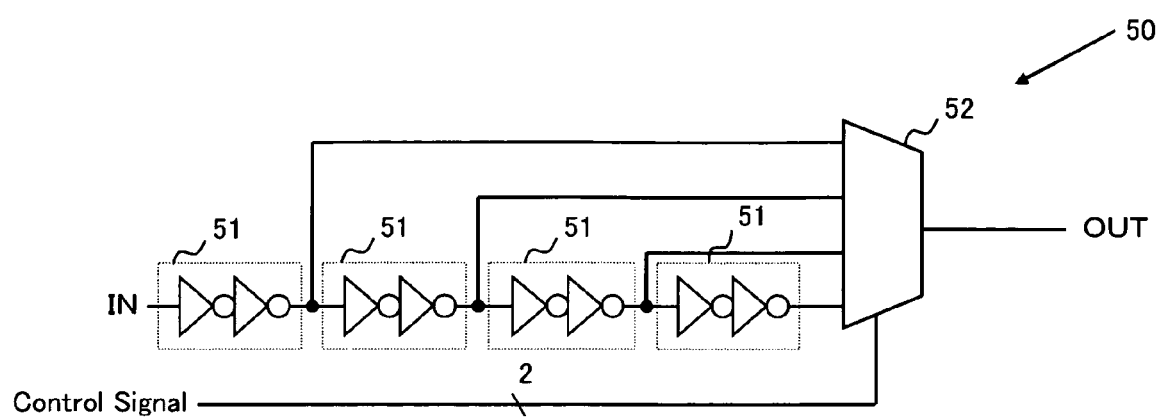
FIG. 10 is a logic circuit diagram showing a circuitry arrangement of the delay circuit in a conventional test circuit.
Figure 11:
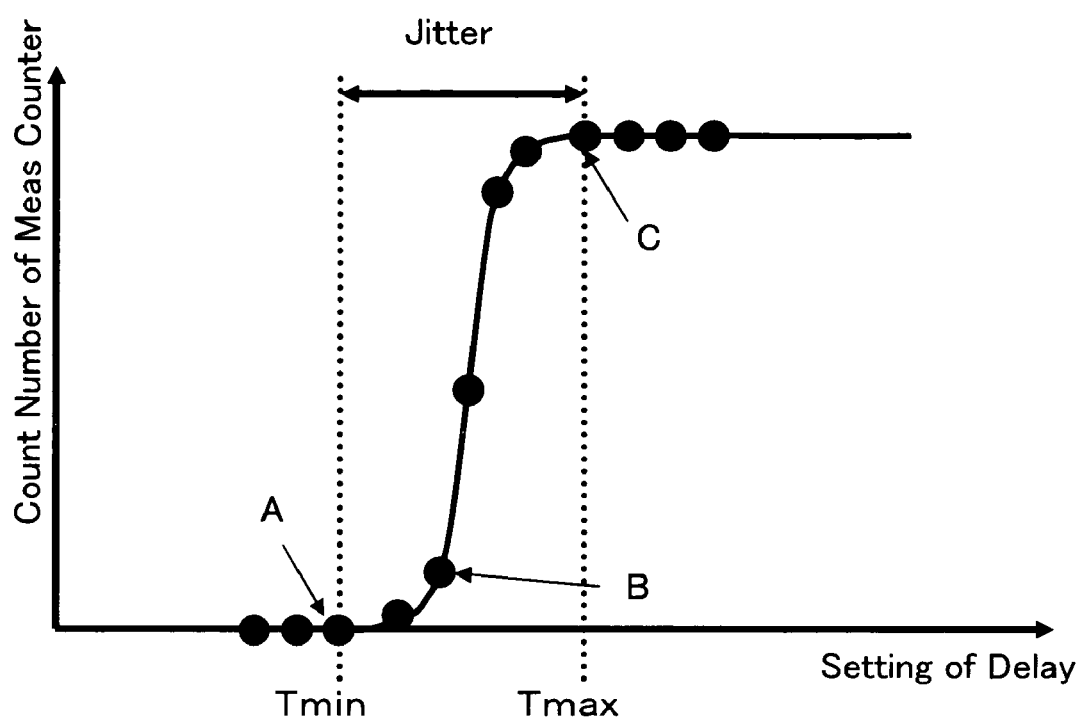
FIG. 11 is an explanatory view showing a method of measuring a jitter with the use of a test circuit disclosed in Citation 1.
Figure 12:
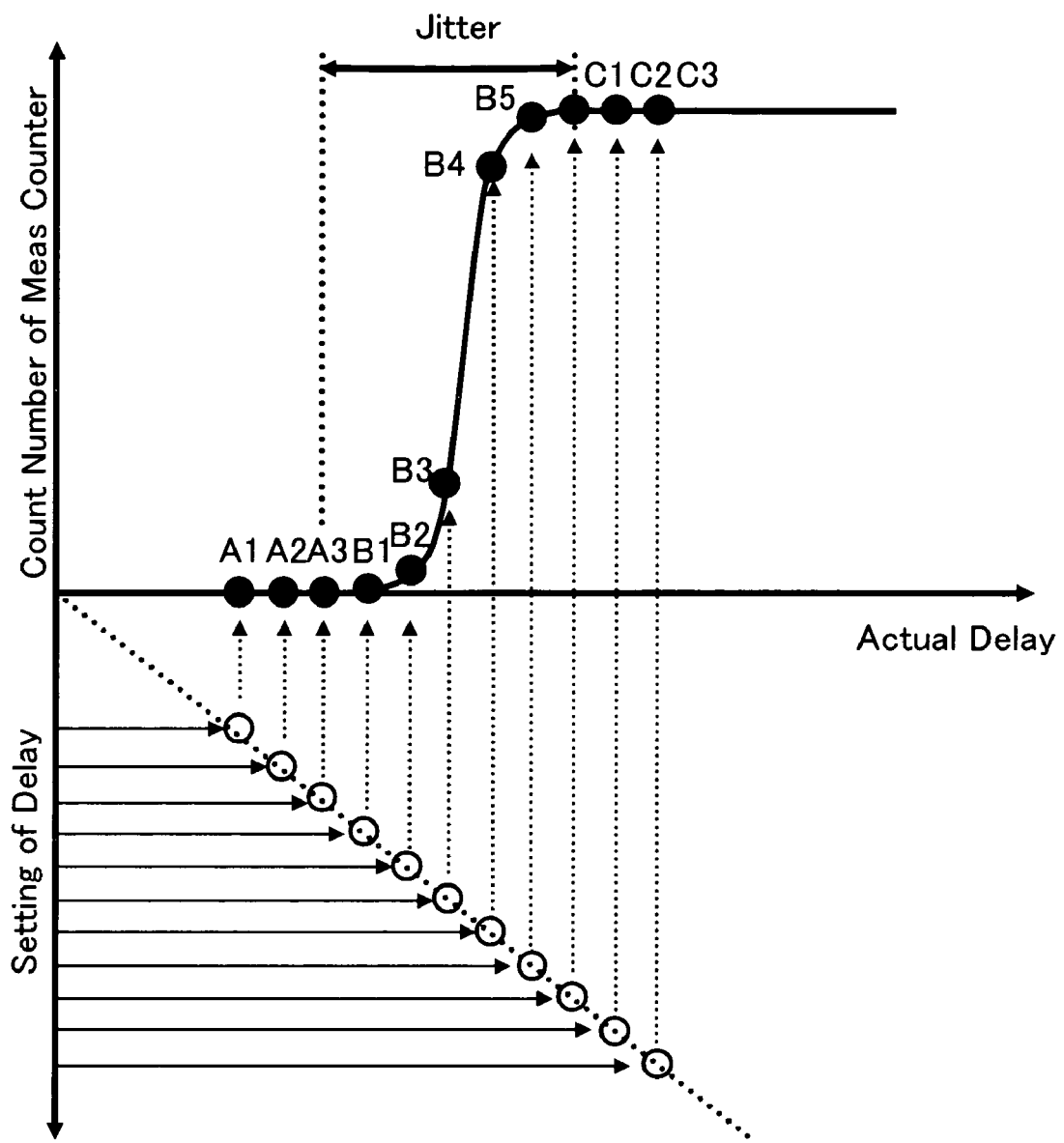
FIG. 12 is an explanatory view showing the method of measuring a jitter with the test circuit disclosed in Citation 1 when the monotony in the delay circuit is maintained.
Figure 13:
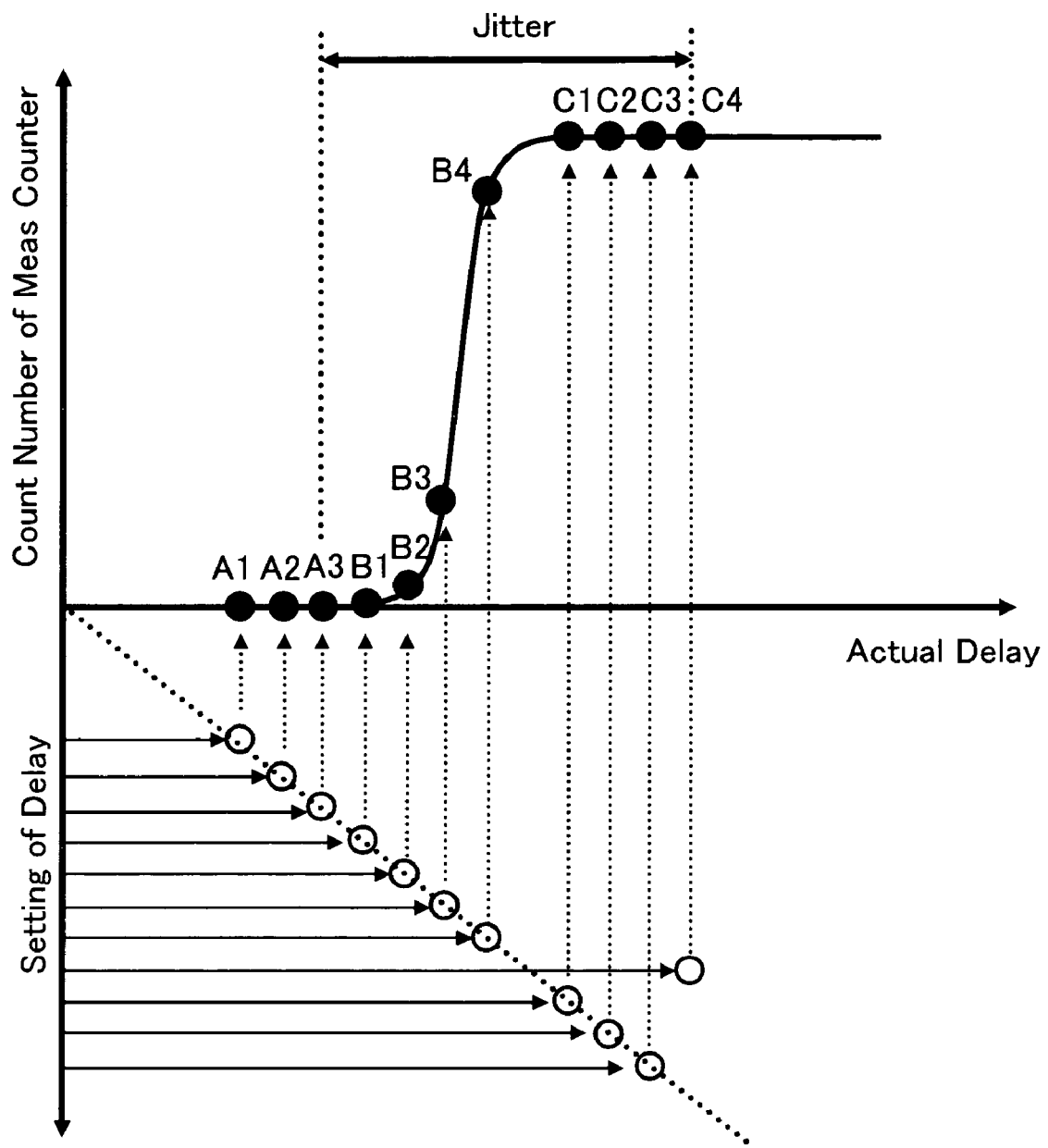
FIG. 13 is an explanatory view showing the method of measuring a jitter with the test circuit disclosed in Citation 1 when the monotony in the delay circuit is not maintained.
Figure 14:
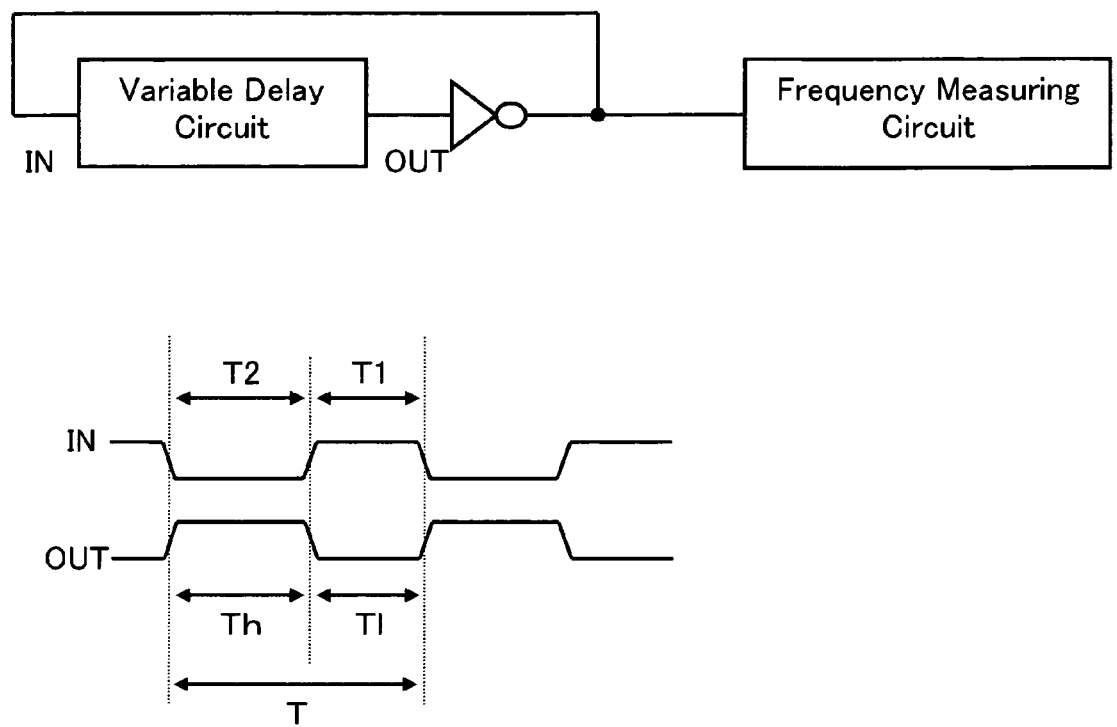
FIG. 14 illustrates a circuitry arrangement of a ring oscillator explaining a duty error in the delay circuit and voltage waveforms at both the input port and the output port of the variable delay circuit.

(5) The controllable element in the inverter circuit 19 is implemented by the MOSFET in the first embodiment or each of the second and third arrangements (1) and (2), but it is not limited to the MOSFET provided that its current drive capability is controllably determined. Also, the inverter circuit 19 including the controllable element is not limited to the arrangement depicted in the first embodiment or each of the second and third arrangements (1) and (2). For example, the arrangement may include such a controllable element 28 as shown in FIG. 8 or 9.

(6) The delay circuit 11 in the first embodiment includes the base delay circuit 16, the variable delay circuit 17, and the control circuit 18. If desired, the base delay circuit 16 and the control circuit 18 may be eliminated.

More specifically, the base delay circuit 16 can be omitted by having its delay Tb being included in the delay (63×Tf) of the variable delay circuit 17 where Tf is the minimum of the delay in the variable delay unit 20. Also, the control circuit 18 is replaced by an external control circuit provided outside the inventive circuit 10.

(7) The variable delay circuit 17 in the first embodiment has 63 of the variable delay units 20 connected in series and arranged of which the delays are controllable separately. Alternatively, the variable delay units 20 are separated into 6 groups which consist of 1 unit, 2 units, 4 units, 8 units, 16 units, and 32 units respectively. As its six groups are connected in series, the variable delay circuit 17 can favorably be controlled for modifying the delay of each group.

The number of the variable delay units 20 in the variable delay circuit 17 is not limited to 63. Although the variable delay units 20 in the variable delay circuit 17 of the first embodiment are identical in the resolution of the delay time, they may be different in the resolution of the delay time as connected in series.

(8) The inventive circuit 10 of the first embodiment is assembled together with the clock generating circuit 30 on a single semiconductor substrate and provided as an LSI chip. A portion of the inventive circuit 10 may be provided externally or separately as an external measuring device. For example, the measuring counter 13 or the frequency measuring circuit 15 are provided outside.

The test circuit according to the exemplary embodiment presented herein can be applied for evaluating timing accuracy of clock signals produced by a PLL circuit or any other circuit at higher degree of the resolution and accuracy.

Although the technology presented herein has been described in terms of the preferred embodiments, it will be appreciated that various modifications and alterations might be made by those skilled in the art without departing from the spirit and scope of the exemplary embodiment. The technology should therefore be measured in terms of the claims which follow.

What is claimed is:

1. A test circuit configured to evaluate timing accuracy of a clock signal comprising:
    a delay circuit whose delay is controllable,
    a phase comparator circuit configured to compare the phases between the clock signal to be examined and a delay clock signal delayed from the clock signal by the delay circuit,
    a measuring counter configured to count a number of outputs of the prescribed comparison result from the phase comparator circuit,
    a signal switching circuit configured to switch an input signal to be received by the delay circuit from the clock signal to a delay signal which satisfies an oscillation condition in which the delay signal is received from the delay circuit thus to develop a ring oscillator, and
    a frequency measuring circuit configured to measure an oscillation frequency when the ring oscillator has been developed by the signal switching circuit, wherein
    the delay circuit includes a variable delay circuit comprising a plurality of variable delay units connected in series, wherein all said variable delay units are part of the signal flow at all times during operation, and
    the delay in each of the variable delay units is controllable independently.

2. The test circuit according to claim 1, wherein the variable delay units are arranged to selectively determine the delay from two or more alternatives.

3. The test circuit according to claim 1, wherein the variable delay unit includes a pair of inverter circuits connected in series and each inverter circuit has a controllable element of which the current drive capability is controllable.

4. The test circuit according to claim 3, wherein the controllable element is a MOSFET and the current drive capability of the controllable element is controlled with its gate input voltage.

5. The test circuit according to claim 3, wherein the controllable element is a MOSFET and the current drive capability of the controllable element is controlled with its back gate voltage.

6. The test circuit according to claim 3, wherein the inverter circuit includes two or more of the controllable elements.

7. The test circuit according to claim 3, wherein the current drive capability of the controllable element in each of the inverter circuits is controlled at multiple levels by a control signal having three or more digit levels.

8. The test circuit according to claim 3, wherein the current drive capability of the controllable element in each of the inverter circuits is controlled at two levels by a binary control signal.

9. The test circuit according to claim 3, wherein the controllable element is an n-channel MOSFET.

10. The test circuit according to claim 1, wherein the test circuit is mounted on a single substrate together with a clock generating circuit configured to generate the clock signal to be examined.

11. A clock generating circuit configured to generate a clock signal using a PLL circuit comprising all or a part, including at least the delay circuit, of the test circuit according to claim 1 for testing the clock signal.

12. An image sensor comprising:
    an optical sensor, a storing unit configured to store a data output of the optical sensor, a transmitting unit configured to transmit the output data stored in the storing unit, and a clock generating circuit configured to generate clock signals to control each action of the optical sensor, the storing unit, and the transmitting unit, wherein
    a part of the clock generating circuit configured to generate a clock signal to control at least the action of the transmitting unit is the clock generating circuit according to claim 11.

13. A delay circuit whose delay is controllable comprising a variable delay circuit which has a plurality of variable delay units connected in series, wherein the delay in the variable delay units is controlled at each or a group of the variable delay units independently, wherein each of said variable delay units includes a pair of inverter circuits connected in series and each inverter circuit has a controllable element of which the current drive capability is controllable, and wherein all said variable delay units are part of the signal flow at all times during operation.

14. The delay circuit according to claim 13, wherein the variable delay units are arranged to selectively determine the delay from two or more alternatives.

* * * * *